(12) United States Patent
Cohen et al.

(10) Patent No.: US 7,172,968 B2
(45) Date of Patent: Feb. 6, 2007

(54) ULTRA THIN, SINGLE PHASE, DIFFUSION BARRIER FOR METAL CONDUCTORS

(75) Inventors: Stephan Alan Cohen, Wappingers Falls, NY (US); Fenton Read McFeely, Ossining, NY (US); Cevdet Ismail Noyan, Yorktown Heights, NY (US); Kenneth Parker Rodbell, Poughguag, NY (US); Robert Rosenberg, Peekskill, NY (US); John Jacob Yurkas, Stamford, CT (US)

(73) Assignee: International Business Machines Corporation, Armonk, NY (US)

( * ) Notice: Subject to any disclaimer, the term of this patent is extended or adjusted under 35 U.S.C. 154(b) by 118 days.

(21) Appl. No.: 10/188,686

(22) Filed: Jul. 3, 2002

(65) Prior Publication Data

US 2002/0175418 A1    Nov. 28, 2002

Related U.S. Application Data

(62) Division of application No. 09/070,394, filed on Apr. 30, 1998, now Pat. No. 6,452,276.

(51) Int. Cl.
    *H01L 21/44* (2006.01)

(52) U.S. Cl. ............... 438/685; 438/656; 438/687

(58) Field of Classification Search ............... 257/324, 257/635, 637, 758, 759, 760, 761, 762, 763, 257/764; 438/118, 622, 623, 624, 625, 648, 438/653, 683, 685, 687, 656
See application file for complete search history.

(56) References Cited

U.S. PATENT DOCUMENTS

| | | | |
|---|---|---|---|
| 3,639,165 A | 2/1972 | Rairden, III | |
| 4,451,503 A | 5/1984 | Blum et al. | |
| 4,505,028 A | 3/1985 | Kobayashi et al. | |
| 4,619,840 A | 10/1986 | Goldman et al. | |
| 4,817,557 A | 4/1989 | Diem et al. | |
| 4,902,645 A * | 2/1990 | Ohba | 438/625 |
| 4,926,237 A * | 5/1990 | Sun et al. | 257/764 |
| 5,126,825 A * | 6/1992 | Harada | 257/764 |
| 5,212,400 A | 5/1993 | Joshi | |
| 5,232,872 A * | 8/1993 | Ohba | 438/648 |
| 5,407,852 A | 4/1995 | Ghio et al. | |

(Continued)

FOREIGN PATENT DOCUMENTS

JP    61 217 576    9/1986

(Continued)

OTHER PUBLICATIONS

B. Davari, "Submicron Tungsten Gate Mosfet with 10 nm Gate Oxide", VLSI Symposium, Japan (1987).

(Continued)

*Primary Examiner*—Hung Vu
(74) *Attorney, Agent, or Firm*—Scully, Scott, Murphy & Presser, P.C.; Robert M. Trepp, Esq.

(57) ABSTRACT

The present invention is directed to an alpha-W layer which is employed in interconnect structures such as trench capacitors or damascene wiring levels as a diffusion barrier layer. The alpha-W layer is a single phased material that is formed by a low temperature/pressure chemical vapor deposition process using tungsten hexacarbonyl, $W(CO)_6$, as the source material.

12 Claims, 4 Drawing Sheets

U.S. PATENT DOCUMENTS

| | | | |
|---|---|---|---|
| 5,429,989 A | * | 7/1995 | Fiordalice et al. .......... 438/648 |
| 5,539,230 A | | 7/1996 | Cronin |
| 5,693,563 A | * | 12/1997 | Teong ........................ 438/627 |
| 5,789,312 A | | 8/1998 | Buchanan et al. |
| 5,847,462 A | * | 12/1998 | Bandyopadhyay et al. . 257/751 |
| 6,271,128 B1 | * | 8/2001 | Tseng ........................ 438/638 |
| 2002/0102849 A1 | * | 8/2002 | Yi et al. ..................... 438/682 |
| 2003/0042610 A1 | * | 3/2003 | Kitada et al. ............... 257/758 |

OTHER PUBLICATIONS

J.R. Creighton, "Non-Selective Tungsten Chemical-Vapor Deposition Using Tungsten Hexacarbonyl", Deposition and Growth: Limits for Microelectronics, Anaheim, CA, USA, Nov. 3-5, 1987, ISSN 0094-243X, AIP Conference Proceedings, USA, pp. 192-201 (1988).

Jae Hyun Sone, et al., "Formation of Low Pressure Chemically Vapour Deposited W Thin Film on Silicon Dioxide for Gate Electrode Application", Thin Solid Films, vol. 253, No. 1/02, pp. 377-381 (1994).

Hiromasa Noda, et al., "Tungsten Gate Technology for Quarter-Micron Application", International Conference on Solid State Devices & Materials, pp. 225-227 (1995).

Hiromosa Noda, "Tungsten Gate Technology for Quarter-Micron Application", Jpn. J. Appl. Phys, vol. 35, pp. 807-811 (1996).

K. E. Greenberg, "Abnormal-Glow-Discharge Deposition of Tungsten." *Appl. Phys. Lett.* 50 (16), Apr. 20, 1987, pp. 1050-1052.

* cited by examiner

ULTRA THIN, SINGLE PHASE, DIFFUSION BARRIER FOR METAL CONDUCTORS

RELATED APPLICATIONS

This application is a divisional of U.S. application Ser. No. 09/070,394 filed on Apr. 30, 1998, now U.S. Pat. No. 6,452,276.

This application is related to U.S. application Ser. No. 08/739,765, filed Oct. 30, 1996, and 09/021,262, filed Feb. 10, 1998, which are both commonly owned by the assignee of the present application.

FIELD OF THE INVENTION

The present invention relates to interconnect semiconductor structures and, in particular to an alpha-phase W barrier layer that is formed in the trenches or vias of such interconnect structures using a low temperature/low pressure chemical vapor deposition technique, wherein tungsten hexacarbonyl, $W(CO)_6$, is employed as the precursor or source material. The alpha-phase W barrier layer of the present invention is ultra-thin (less than 15 nm), essentially impermeable to conductive materials, exhibits good adhesion to the dielectric material and the conductive material of the interconnect structure, and it conformally and continuously covers a high aspect ratio trench (greater than 3:1 depth/width). Hence, the alpha-phase W barrier layer of the present invention can be used in many interconnect structures wherein such a barrier layer is required. This includes, but is not limited to: damascene structures, memory cell capacitors and all other wiring applications for logic, memory and input/output applications. The barrier layer of the present invention can also be used in gate stack applications between polysilicon and a metallization, i.e. conductive, layer.

BACKGROUND OF THE INVENTION

In order to fabricate high performance interconnect structures for state of the art semiconductor devices, it is necessary to embed a conductive material such as Cu into a dielectric material having a trench or via formed therein. Organic as well as inorganic dielectric materials are known and are currently being employed in such applications. Examples of organic dielectrics include: polyimides, paralyne polymers, silicon polymers, i.e. polysiloxanes, diamond, diamond-like carbon and the like, while $SiO_2$, $Si_3N_4$, silicon oxide/nitride mixtures or alternating oxide/nitride layers are known inorganic dielectrics.

While Cu is currently being developed for use in semiconductor manufacturing by the assignee herein for such applications, it exhibits a number of undesirable properties. One highly undesirable property that Cu exhibits is that it generally diffuses through the dielectric material at the moderately elevated temperatures encountered during subsequent processing steps. The out-diffusion of Cu can have a number of deleterious effects on the interconnect structure being manufactured. For example, the out-diffusion of Cu may cause short circuiting of the wires or it may degrade the performance of the MOS device.

To overcome this out-diffusion problem exhibited by Cu, a barrier layer is generally formed between Cu and the dielectric material. In prior instances, the material used in forming the barrier layer has not been compatible with the dielectric material, i.e. it does not adhere well to the dielectric material. Thus, an additional adhesion layer has been required in order to achieve satisfactory adhesion of the barrier layer material to the dielectric.

A typical prior art interconnect structure containing a dielectric, an additional adhesion layer, a barrier layer and Cu is shown in FIG. 1. Specifically, this prior art interconnect structure shown in FIG. 1 comprises a dielectric 10 having at least one trench or via formed therein, an adhesion layer 12, a barrier layer 14 and Cu region 16. The trench or via is formed in the surface of dielectric 10 using standard lithographic patterning techniques that are well known to those skilled in the art. It should be emphasized that although the various layers are shown as conformal layers in FIG. 1 in reality the layers are non-conformal since the previous prior art processing techniques used in forming the various layers are incapable of providing conformal trench coverage.

As stated above, the adhesion layer is only required when barrier layer 14 is not compatible with dielectric 10. Suitable materials for the adhesion layer include: Ti, Cr and other similar materials. The adhesion layer is formed using standard deposition techniques such as sputtering. The Cu region is formed using plating, chemical vapor deposition, plasma vapor deposition and like techniques which are also well known in the art.

The barrier layer in the prior art structure of FIG. 1 is typically composed of a metal such as Ta. The prior art barrier layers may be formed using sputtering and other known deposition techniques.

Although a wide range of materials can be employed as barrier layer 14, the prior art barrier layers do not meet all of the following requirements which are now deemed as necessary in the fabrication of interconnect structures:

(1). The barrier layer must be impermeable to Cu under the conditions to which the device will experience in further processing, as well as under operating conditions;

(2). The barrier layer must exhibit good adhesion to the dielectric comprising the interconnect structure; therefore, obviating the need for an additional adhesion layer;

(3). The barrier layer must be formed in such a manner as to comformally and continuously cover a high aspect ratio trench. By "high aspect ratio", it is meant a trench wherein the depth to width ratio is greater than 3:1;

(4). The barrier layer should be as thin as possible, so as to maximize the fraction of the cross-section of the trench which may be filled with the Cu wiring, so as to maximize wire conductivity;

(5). The barrier layer should be of uniform thickness throughout the structure, i.e. coverage of the interconnect trench should be conformal. A barrier failure will be determined by the thinnest region of the structure, non-uniformity in thickness will necessarily be wasteful of the trench cross-sectional area;

(6). The barrier layer should be made from a material that has the lowest possible resistivity so as to aide in minimizing the total wire resistivity; and (7). The barrier layer should be resistant to oxidation so as to facilitate the filling of the remaining trench volume with Cu with a minimum of pretreatment steps or processes.

While prior art barrier layers may satisfy one or more of the above criteria, none of the barrier layers provided in prior art processes are known to satisfy all of them. Thus, there is a need to develop a new barrier layer that satisfies each and every criteria mentioned hereinabove. Such a barrier layer would be extremely useful in all semiconductor interconnect applications wherein Cu or another conductive metal is found.

SUMMARY OF THE INVENTION

One object of the present invention is to provide a barrier layer for use in interconnect trench or via structures which satisfies the above mentioned criteria listed under items 1–7.

One specific objective met by the present invention is that it provides a barrier layer that is compatible, i.e. adheres, with both the dielectric material and the conductive material so as to eliminate the need of an additional adhesion layer in interconnect structures.

A second specific objective met by the present invention is that it provides a barrier layer which is ultra-thin (less than 15 nm) and is capable of conformally covering high aspect ratio trenches or vias.

These and other aspects and advantages are achieved in the present invention by utilizing alpha-W as a barrier layer, wherein the alpha-W is formed by a low temperature/low pressure chemical vapor deposition (CVD) process using tungsten hexacarbonyl, $W(CO)_6$, as the precursor, i.e. source material. Specifically, the barrier layer of the present invention comprises alpha-phase W which is a single phased material that is formed from $W(CO)_6$ utilizing a low temperature/low pressure CVD process. No other phases such as β-W are formed by utilizing the method of the present invention.

Another aspect of the present invention relates to a method of forming an alpha-W barrier layer on the sidewalls and bottom of a trench or via that was previously formed in a dielectric material. Specifically, the alpha-W barrier layer is formed in the present invention by depositing a conformal layer of alpha-W having a thickness of less than 15 nm on the sidewalls and bottom of a trench or via region previously formed in a dielectric material, wherein said deposition is carried out by chemical vapor deposition (CVD) using $W(CO)_6$ as a source material.

A still further aspect of the present invention relates to a structure comprising at least one layer of a semiconducting, e.g. polysilicon, or dielectric material having a layer of alpha-W over a portion of said semiconducting or dielectric material; and a conductive material formed over said alpha-W layer. The alpha-W is formed over the material in accordance with the method described hereinabove in forming the alpha-W barrier layer.

A yet further aspect of the present invention relates to interconnect structures that contain the alpha-W barrier layer of the present invention inside the trench or via structure. Specifically, the interconnect structure of the present invention comprises one or more layers of a dielectric material having at least one trench or via region therein; a barrier layer of the alpha-W covering the sidewalls and the bottom of the at least one trench or via region, wherein said alpha-W barrier layer is a continuous single phased material having a thickness of less than 15 nm; and a conductive material formed over said alpha-W barrier layer in said at least one trench or via region. Vias may also be formed in a respective dielectric extending from the bottom of a trench to an interconnect wiring trench below.

Suitable interconnect structures that are contemplated in the present invention include, but are not limited to: memory cell capacitors including plate capacitors, crown capacitors, stack capacitors and other like capacitors; damascene structures including dual and single; multiple wiring levels containing a plurality of vias and metal lines; and other like interconnect structures.

DETAILED DESCRIPTION OF THE INVENTION

Figure 1:
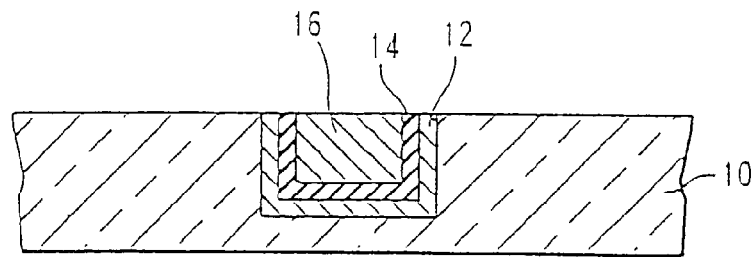
FIG. 1 is a cross-sectional view of a prior art interconnect structure.

The present invention, which is directed to a barrier layer comprising alpha-W, will now be described in greater detail by referring to the drawings that accompany this application. It should be noted that in the drawings like elements or components are referred to by like and corresponding reference numerals. It is further emphasized that while the present invention illustrates plate capacitors and dual damascene interconnect structures, it can be used in other applications wherein a conductive material such as Cu is employed as an electrode or wiring means. Another potential application for the alpha-W barrier layer of the present application is in a gate stack wherein the alpha-W would be formed between polysilicon and an outer metallization layer using the method of the present invention.

Figure 2:
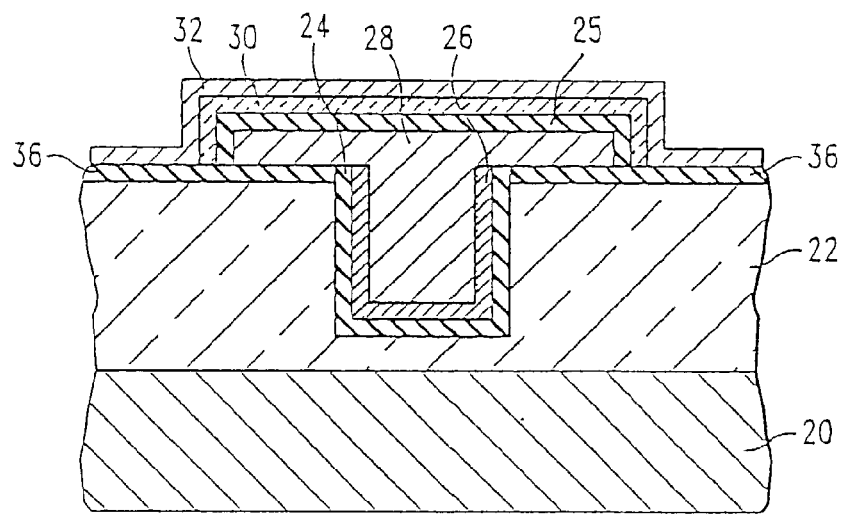
FIG. 2 is a cross-sectional view of a trench capacitor structure of the present invention which contains alpha-W as the barrier layer.
Figure 3:
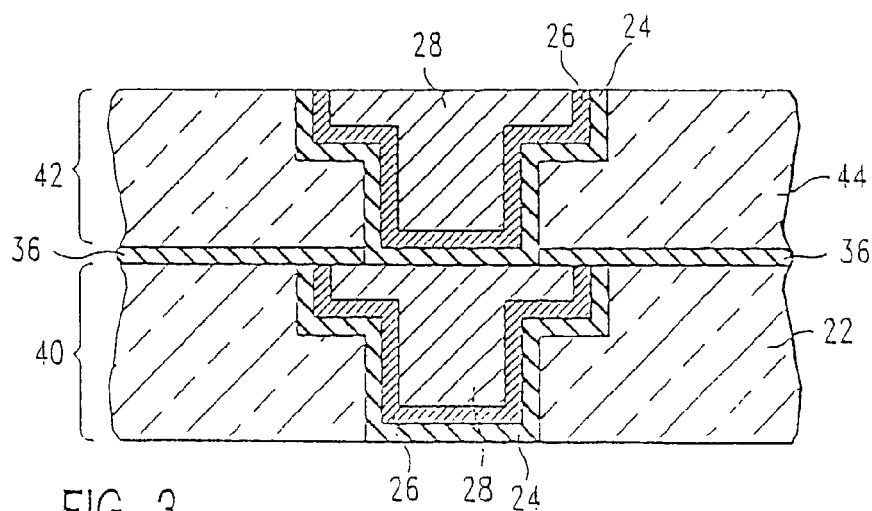
FIG. 3 is a cross-sectional view of a dual damascene structure of the present invention which contains alpha-W as the barrier layer.

Referring to the drawings in more detail, and particularly referring to FIGS. 2 and 3, there are shown two types of interconnect structures that may contain the barrier layer of the present invention therein, i.e. a continuous layer of alpha-W which is formed by CVD using $W(CO)_6$ as the source material. FIG. 2 represents a parallel plate capacitor whereas FIG. 3 is a dual damascene interconnect structure. It is emphasized that although the present invention illustrates only the above two structures it is nevertheless not limited thereto. Instead, the alpha-W barrier layer of the present invention can be used in any application wherein a conductive metal such as Cu is filled inside a trench or via of a dielectric material. It should also be emphasized that the drawings of the present invention show only layers and materials that are necessary to describe the invention; other layers and materials which are known to those skilled in the art are also contemplated in the present invention.

Specifically, FIG. 2 illustrates a parallel plate capacitor which comprises semiconductor substrate 20, dielectric 22 having an opening, i.e. trench or via, in its surface, an alpha-W barrier layer 24 prepared in accordance with the present invention, optional metal seed layer 26, conductive material 28, alpha-W barrier layer 25, dielectric 30 and electrode 32. The capacitor structure of FIG. 2 also includes barrier layer 36 which may be composed of alpha-W or another material such as silicon nitride which prevents contact of conductive material 28 and dielectric 22. When alpha-W is used as barrier layer 36, the method of the present invention is employed. When other barrier materials are used, conventional deposition techniques are employed in forming barrier layer 36.

This capacitor structure is prepared utilizing conventional processing steps well known to those skilled in the art except for the deposition of alpha-W barrier layers 24 and 25 which are formed utilizing the low temperature/pressure CVD process described hereinbelow. It is noted that barrier layer 36 may also be formed utilizing the method of the present invention. Since all of the other processing steps are known to those skilled in the art, a detailed description of the same is not given herein.

Semiconductor substrate 20 may contain appropriate diffusion and isolation regions to form electronic devices which are embedded in semiconductor substrate 20. For clarity, these regions as well as others are not shown in the drawings of the present invention. Any suitable material that is semiconducting may be employed in the present invention as semiconductor substrate 20. This includes, but is not limited to: silicon (Si), Ge, SiGe, GaAs, InAs, InP and all other III/V compounds. Of these semiconducting materials, it is highly preferred in the present invention that semiconductor substrate 20 be composed of Si or SiGe.

The semiconductor substrates employed in the present invention may be of the p-type or n-type depending upon the type of electronic device being manufactured.

Dielectric 22, which contains a trench region formed in its surface, includes any insulative material including inorganic materials as well as organic materials. Suitable dielectrics that can be employed in the present invention include: but are not limited to: $SiO_2$, $Si_3N_4$, polyimides, diamond, diamond-like carbon, silicon polymers, paralyne polymers and fluorinated diamond-like carbon. These dielectrics may be doped or undoped. When doped, the dopant may be boron, fluorine, phosphorus, silicon, Ge or another like dopant material.

Dielectric 22 may contain appropriate word lines, bit lines, and other components which are typically present in capacitor structures of the type illustrated by FIG. 2. For clarity, these elements are not shown in the drawings of the present invention. Reference is made to copending and coassigned U.S. application Ser. No. 08/636,457, filed Apr. 23, 1996, to Andricacos, et al. and Ser. No. 08/886,459, filed May 30, 1997, to Grill, et al., which are both incorporated herein by reference, for providing a detailed description of capacitor structures and how the same are fabricated.

As stated above, many of the processing steps used in forming the structure shown in FIG. 2 are known. For example, the structure is formed using conventional techniques which include: forming dielectric 22 on semiconductor substrate 20 by, for example, CVD, spin-on coating and plasma vapor deposition, and then a trench is formed in dielectric 22 utilizing standard lithography techniques well known to those skilled in the art.

Next, alpha-W barrier layer 24 is formed in the trench of the structure utilizing the method of the present invention which will be described in greater detail hereinbelow.

The structure in FIG. 2 also includes an optional metal seed layer 26. Examples of metal seed layers nad how the same are formed can be found in co-assigned U.S. application Ser. No. 09/067,851, filed Apr. 27, 1998 to Edelstein, et al., the contents of which are neing incorporated herein by reference. The metal seed layers that are employed in the present invention include, but are not limited to: Cu and Al. The seed layer, when present, is formed by conventional means including souttering, CVD and plating.

In addition to optional seed layer 26, a conductive region 28 composed of a conductive material such as Cu, Al, or alloys of Cu or Al is formed such that conductive region 28 at least fills the inside of the trench region. A preferred material for conductive region 28 is Cu. Reference is made to copending and coassigned U.S. application Ser. No. 08/768,107, filed Dec. 16, 1996, to Andricacos, et al., the contents of which are being incorporated herein by reference, for describing various means for forming a conductive material in a trench region. In FIG. 2, conductive region 28 extends outside of the trench and it is patterned to a desired shape. It is also within the contemplation of the present invention to have a planarized conductive region which does not extend outside of the trench. Barrier layer 36, which may or may not be composed of alpha-W, prevents contact of conductive region 28 with dielectric 22.

The structure in FIG. 2 further includes an alpha-W barrier layer 25 formed over conductive region 28 using the method of the present invention, a dielectric 30 which is formed over barrier layer 25 utilizing conventional deposition techniques such as CVD. Suitable materials for dielectric 30 include, but are not limited to: $Si_3N_4$, oxynitrides, metal oxides such as $Ta_2O_5$ and $TiO_2$, $(Ba,Sr)TiO_3$ (BST) and $(Pb,La,Zr)TiO_3$ (PLZT). The final component of the plate capacitor shown in FIG. 2 is an electrode 32 which is formed utilizing conventional deposition techniques including plating. The material used in forming electrode 32 includes, but is not limited to: W, Cu, Al, Pd, polysilicon and Pt.

Before addressing how alpha-W barrier layers 24 and 25 are formed in FIG. 2, attention is directed to the interconnect structure shown in FIG. 3. Specifically, FIG. 3 illustrates a dual damascene structure which comprises a lower interconnect level 40 and an upper interconnect level 42. Each level includes a via region and a metal region. The via region is distinguishable from the metal region in that it has a narrower opening as compared with the opening of the metal region. Lower interconnect level 40 includes dielectric 22 having an opening or trench therein that is filled with alpha-W barrier layer 24, optional metal seed layer 26 and conductive region 28. On top of lower interconnect level 40 is an upper interconnect level 42 which includes dielectric 44 having a trench region exposing the filled trench of lower interconnect level 40. The trench region of upper interconnect level 42 is filled with an alpha-W barrier layer 24, an optional seed layer 26 and conductive material 28. Between each interconnect level, a barrier layer 36 is formed therebetween. When alpha-W is used as barrier layer 36, the method of the present invention is employed. Alternatively, when other barrier materials, besides alpha-W, are employed, conventional deposition techniques are used in forming the same.

As was the case, with the capacitor structure shown in FIG. 2, the damascene structure shown in FIG. 3 is prepared utilizing standard damascene processing steps known in the art except for the alpha-W barrier layer which is formed on the sidewall and bottom of the trench utilizing the method of the present invention which will be described hereinbelow.

Many of the elements illustrated in FIG. 3 are the same as shown in FIG. 2 and thus the description above concerning those elements applies here for this figure. The only element not previously described is dielectric 44 which can be composed of the same or different material as dielectric 22.

The formation of the alpha-W barrier layers in FIGS. 2 and 3 as well as other interconnect structures which contain a trench or via region and a conductive region therein will now be described in detail. Reference is also made to U.S.

application Ser. No. 08/739,765, filed Oct. 30, 1996 and 09/021,262, filed Feb. 10, 1998, the contents of both are being incorporated herein by reference, for disclosing the formation of a W gate material which is deposited by CVD using $W(CO)_6$ as the source material.

Specifically, a barrier layer of alpha-W, e.g. layer 24, is formed inside the trench of dielectric 22 and/or 44 so as to provide a conformal layer which continuously covers the sidewalls and the bottom of the trench by employing CVD using $W(CO)_6$ as the source material under the temperature and pressure conditions defined hereinbelow which are sufficient to form alpha-W barrier layer 24 inside the trench of dielectric 22 or 44. It should be emphasized that the same conditions are employed in forming alpha-W barrier layer 25 shown in FIG. 2 except that barrier layer 25 is formed over conductive region 28.

Figure 4:
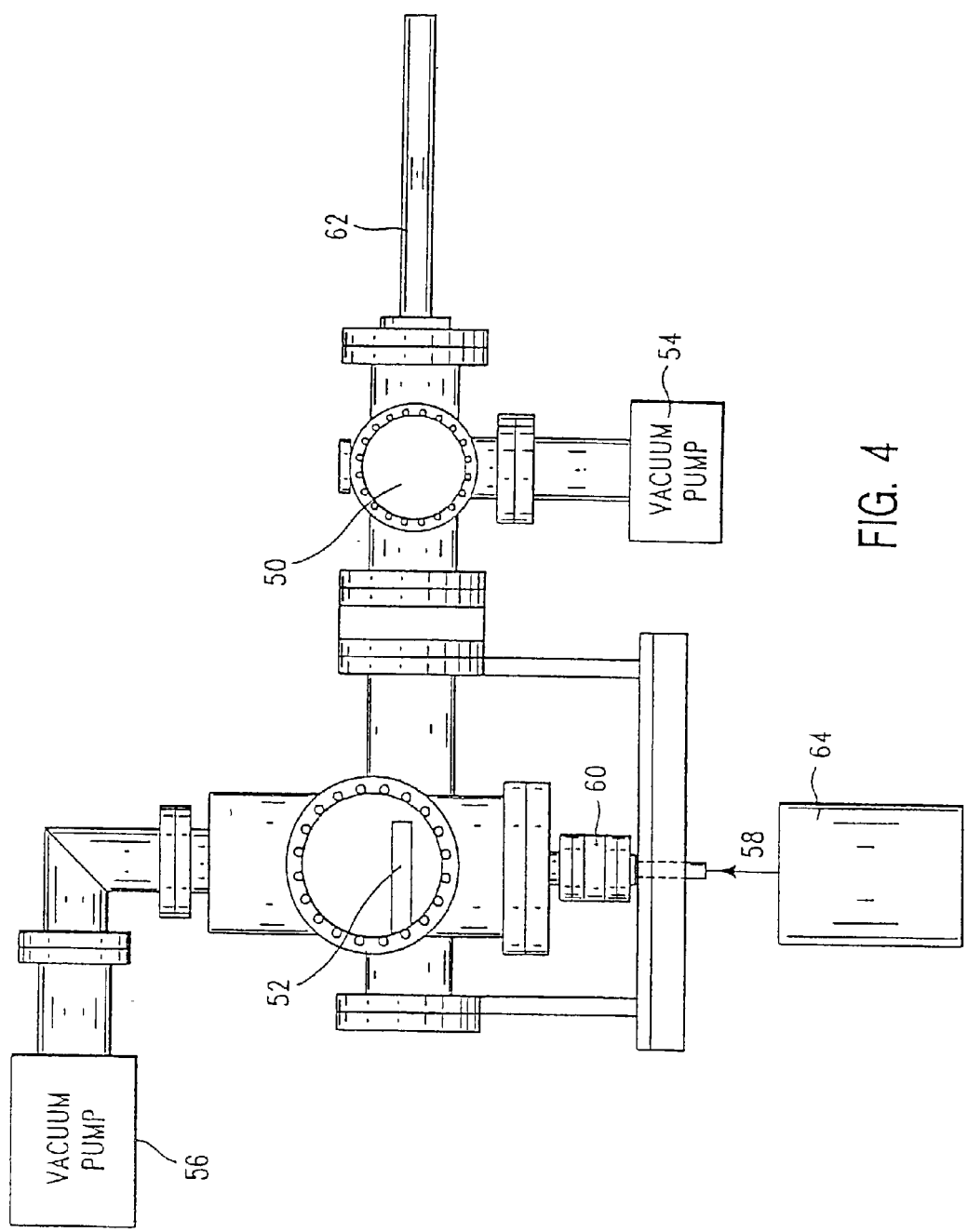
FIG. 4 is a schematic diagram of a CVD apparatus which is used in the present invention to deposit the alpha-W barrier layer.

Reference is made to FIG. 4 which shows a CVD apparatus that can be employed in the present invention to form the alpha-W barrier layer. Specifically, this CVD apparatus includes a load-lock stainless steel port 50 which comprises a graphite sample holder cartridge, not shown in FIG. 4, wherein the interconnect structure containing the opened trench or via-is placed. The CVD apparatus further includes a chamber 52 which contains a heater (not shown) for heating the sample during deposition and an ultra-high vacuum pump 54 for controlling the base pressure prior to deposition and a second ultra-high vacuum pump 56 for controlling the reactor pressure during deposition.

The source material 58, tungsten hexacarbonyl, $W(CO)_6$, is introduced from tank 64 into chamber 52 via a stainless steel valve 60 and is directed to the opened trench interconnect structure which is contained within the CVD apparatus.

The specific operation of the CVD apparatus shown in FIG. 4 would comprise first placing the interconnect structure into port 50 wherein the base pressure of the system is brought down to the desired level by ultra-high vacuum pump 54. After the desired base pressure is reached, tube 62 is used to push the interconnect structure into chamber 52 wherein vacuum pump 56 and the heater are used-to control the deposition conditions. The source material 58 from tank 64 travels through valve 60 into chamber 52 and is used in the deposition process.

Any grade of $W(CO)_6$ can be used in the present invention in forming the alpha-W barrier layer. If a low purity $W(CO)_6$ grade is used, it can be purified prior to being introduced into chamber 52 using purification techniques well known to those skilled in the art.

The base pressure of the reactor prior to conducting the deposition step is evacuated to about $1\times10^{-8}$ Torr or pressures lower than $1\times10^{-8}$ Torr. Such base pressures are required in the present invention in order to remove any contaminates such as oxygen that may be present in the source material or the system prior to deposition. The presence of such contaminates may inhibit the formation of pure alpha-W.

CVD of $W(CO)_6$ occurs at a temperature of from about 250° to about 600° C. More preferably, the CVD deposition of W occurs at a temperature of from about 275° to about 500° C. For optimum conductivity, it may be desirable to add hydrogen to the W source material when operating at deposition temperatures of less than 450° C. The pressure of the reactor during deposition is from about $1\times10^{-6}$ to about $3\times10^{-3}$ Torr. More preferably, the deposition of $W(CO)_6$ occurs at a pressure of from about $1\times10^{-4}$ to about $2\times10^{-3}$ Torr.

The CVD process is carried out for a time period of from about 3 minutes to about 4 hrs. Longer and shorter deposition times than those specified above are also contemplated herein.

It is noted that these conditions are sufficient to form an alpha-phase W barrier layer 24 inside the trench of the interconnect structure. The same conditions are also capable of forming an alpha-phase barrier layer 25 over conductive region 28, as is shown in FIG. 2. The term "alpha-phase" is used herein to denote W which is characterized as having the body centered cubic (bbc) structure, i.e. a crystal structure wherein W atoms are located at each corner of a cubic array and one W atom is located in the middle of the cubic array. It is further emphasized that the CVD conditions are sufficient to form W which has a single phase. This is critical in interconnect structures since multiple phases can cause defect formation in the barrier layer which may result in the failure of the barrier layer to prevent the out-diffusion of Cu. This can occur when upon heating the thermodynamically less stable phase (beta-W) transforms to the more stable phase (alpha-W) with a change in specific volume. This volume change results in microcracks in the material along which Cu can travel. This barrier layer failure may ultimately result in device degradation or device failure.

It is also noted that under the above conditions a conformal and continuous barrier layer comprising alpha-W having a thickness of less than 15 nm is provided inside the trench. More specifically, the above conditions are sufficient to form an alpha-W barrier layer that has a thickness of no more than 7.0 nm. Lower or higher thicknesses are possible provided that a continuous film be formed by the deposition process. The average thickness variation over typical device dimensions of the CVD deposited alpha-W on a given flat surface is no more than 5%.

It is further noted that the alpha-W barrier layer of the present invention meets all seven criteria mentioned in the Background Section of the present application. Hence, it provides properties such as being impermeable to Cu diffusion, good adhesion and conformally and continuously covers a high aspect ratio trench which are heretofore not meet by prior art barrier layers.

It should also be understood that the deposition of W using CVD or sputtering techniques is well known in the art and it is generally applied as a wiring means in packaging applications. In prior CVD applications, tungsten hexafluoride, $WF_6$, is typically used as the source material not $W(CO)_6$. Little attention has been given to the use of tungsten carbonyls in wiring applications since relatively high temperatures are necessary to produce reasonably pure W films.

The formation of W layers using $WF_6$ CVD chemistry have been previously disclosed in the prior art. This process, however, differs fundamentally from the present invention, in that $WF_6$ cannot be used to deposit W directly onto dielectric materials. Instead, thick layers of silicon must first be deposited onto the dielectric material in a chemical activation step, and then the silicon is reacted away (to form $SiF_4$) leaving W in its stead.

Moreover, it has been determined that exposure of even quite thick oxide films (250 nm) to $WF_6$ causes, without any exceptions, complete device failure, i.e. it causes the oxide to become excessively leaky in terms of its current. Other techniques besides CVD have been employed such as sputtering W however, none of the prior art processes are capable of depositing alpha-W directly onto dielectric materials so as to achieve the objectives of the present invention.

The following example is given to illustrate the scope of the present invention. Because this example is given for illustrative purposes only, the invention embodied therein should not be limited thereto.

EXAMPLE

A series of experiments were performed in order to demonstrate the effectiveness of the alpha-W barrier layer of the present invention.

I. Demonstration of Impermeability

A substrate comprising a planar layer of Cu having a thickness of 300 nm formed on the surface of silicon was exposed to $W(CO)_6$ in accordance with the CVD processing conditions mentioned hereinabove. Specifically, the W deposition was carried out in a CVD apparatus at a temperature of about 450° C. and a deposition pressure of about $5 \times 10^4$ Torr. Deposition was carried out at these conditions for a time period of about 8 minutes which was sufficient to form a continuous alpha-W barrier layer having a thickness of about 7 nm.

The resulting structure was analyzed by X-ray photoemission spectroscopy (XPS) to ensure that there was no Cu present on the surface. This sample which contained no Cu on the surface was then annealed in vacuum for 70 hours at 500° C. These test conditions were more stringent than the conditions used under normal processing conditions—3 hours at 450° C.—which are typically sufficient to induce failure in prior art barrier layers. After annealing, the sample was reanalyzed by XPS to see if any Cu had diffused through the alpha-W barrier layer, none however, was observed.

In another experiment, alpha-W was deposited by CVD onto a $SiO_2$ layer which was previously formed on a Si substrate using the same conditions described above. Afterwards both Al and Cu dots were deposited on top of the CVD alpha-W layer and subsequently used as metal masks while the W between the metal masks were milled away.

Figure 5:
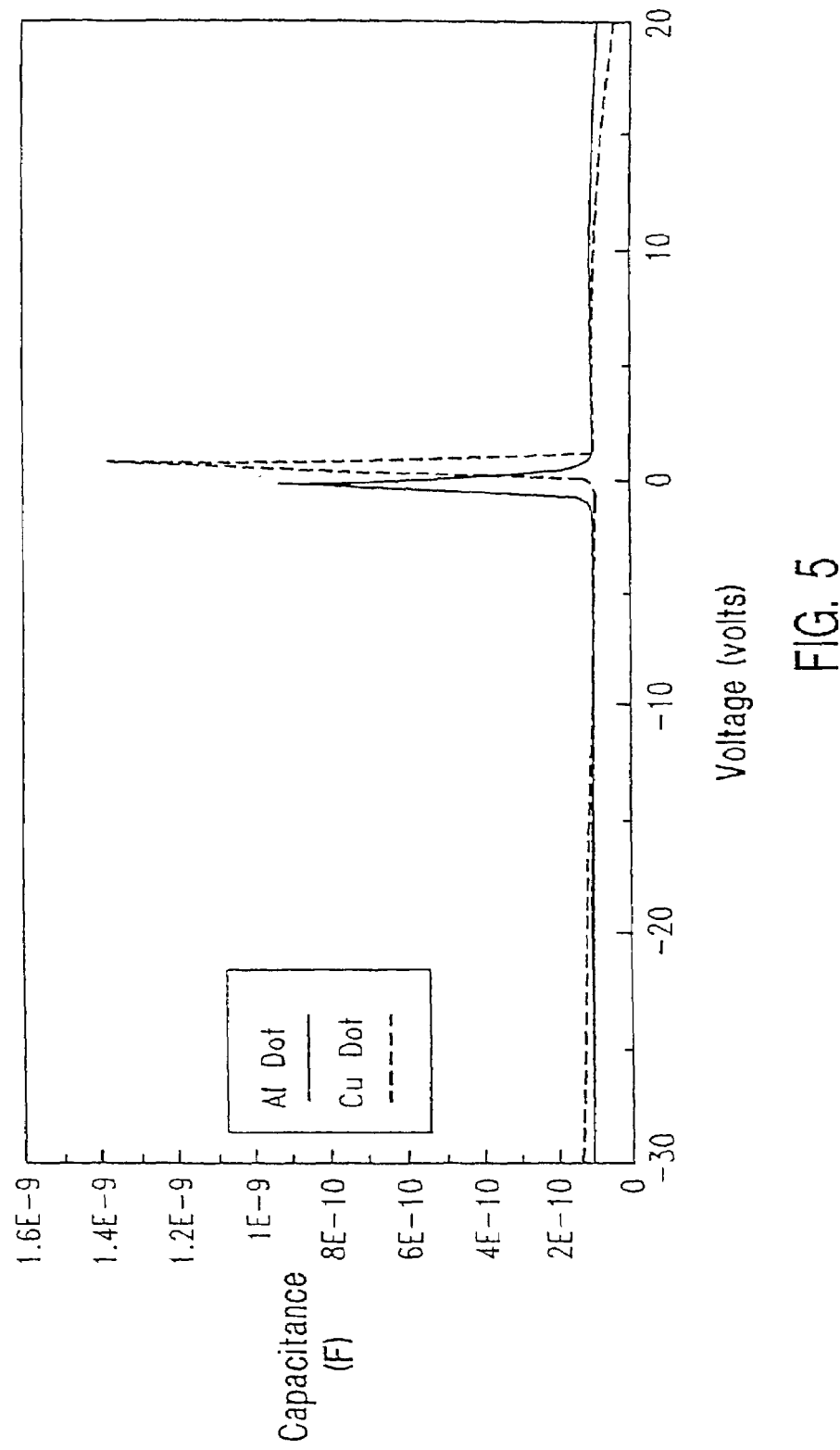
FIG. 5 is a triangular voltage sweep graph (capacitance vs. voltage) of a $SiO_2$/Si substrate containing an alpha-W barrier layer formed in accordance with the present invention.

The milled sample was then subjected to bias temperature stressing (BTS) which was carried out at a temperature of 300° C. and a voltage of 2 MV/cm for 5 hours. These conditions are normally sufficient to drive the Cu into the $SiO_2$ dielectric layer. Thereafter, the sample was subjected to triangular voltage sweep (TVS) by varying the voltage and measuring the capacitance at a desired voltage. FIG. 5 shows the results of the TVS experiment. Specifically, FIG. 5 shows that two peaks are present in the sample. The peaks were determined to be sodium peaks that were originally present in the sample. No Al or Cu peaks were observed—this is evident in that no peaks are found in the negative voltage range wherein Cu typically resides—. The TVS data thus shows that the presence of the alpha-W barrier layer of the present invention prevents Cu from diffusing into the $SiO_2$ dielectric layer.

The results of the above two experiments illustrate that the CVD deposited alpha-W is a robust diffusion barrier layer.

II. Demonstration of Adhesion

Numerous samples of W on a $SiO_2$ layer which was previously formed on a Si substrate were formed by the CVD method described above in a variety of thicknesses (3–100 nm) and structures consisting of both blanket films and long wire structures. Adhesion was tested using a scotch tape technique known to those skilled in the art and these test results revealed that the adhesion was invariably excellent (by the tape test) and remained so after temperature excursions as high as 750° C.

In a comparative study, W was deposited on a $SiO_2$ layer which was previously formed on a Si substrate by sputtering. Under the same high temperature excursion as the CVD deposited alpha-W, the wiring structures containing sputtered W delaminated.

III. Demonstration of Conformal Coverage

In current practice, it is only necessary to coat trenches which are typically about 0.3 microns wide with a 3:1 aspect ratio. To provide a rigorous test for conformal coverage, overhang structures were fabricated which had a base width of only about 0.05 microns and an aspect ratio of about 5:1. From the SEM data it can be seen that conformality of growth of alpha-W by CVD was so good that these structures could have been completely filled with alpha-W. This represents a much more difficult proposition than merely providing a coating to the walls. Thus, the conformal growth characteristics of the method far exceeds the conformal requirements of current practice.

Figure 6A:
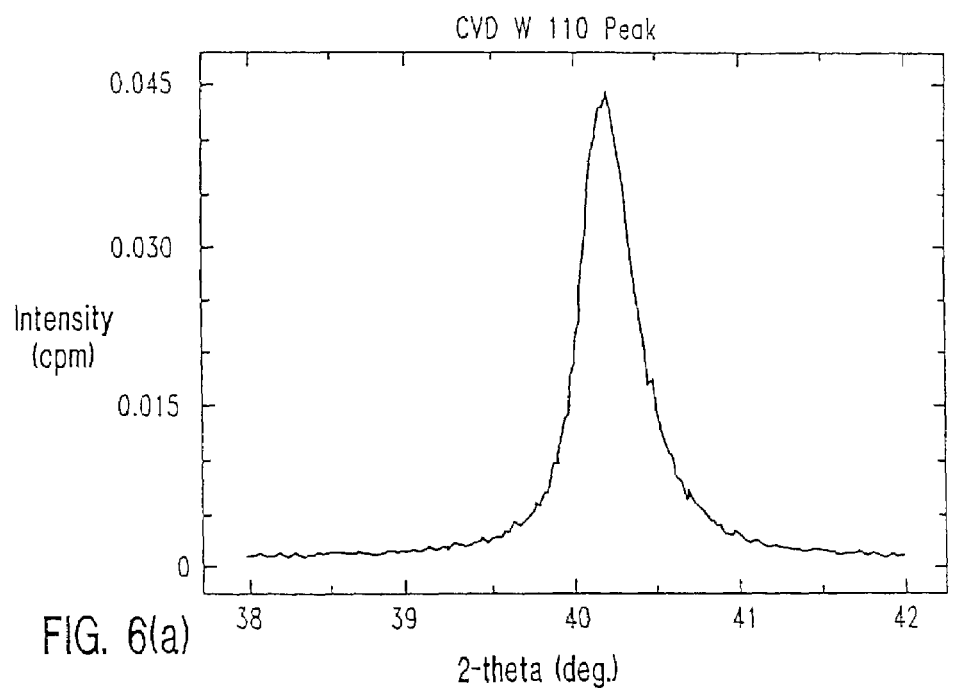
FIGS. 6(a) and (b) are X-ray crystallography data for (a) alpha-W prepared in accordance with the present invention; and (b) sputtered W which contains both alpha-phase W and beta-phase W.
Figure 6B:
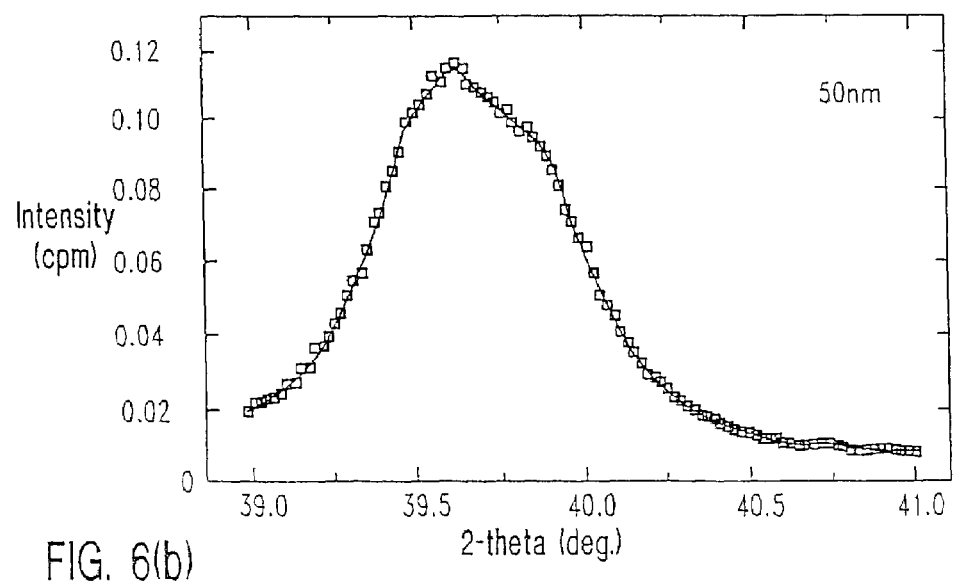

IV. Demonstration of the Structural Differences Between Alpha-W Formed in Accordance with the Present Invention and Sputtered W X-ray crystallography was used to characterized a first sample containing 50 nm sputtered W on a layer of $SiO_2$ which was previously formed on a Si substrate and a second sample containing alpha-W which is formed on a layer of $SiO_2$ which was previously formed on a Si substrate using the low temperature/pressure CVD process of the present invention. Reference is first made to FIG. 6(*a*) which shows the X-ray data for the CVD deposited W. Specifically, this figure shows a single symmetrical peak in the 2-theta diagram which is characteristic of 110 alpha-W. In regard to the sputtered W, reference is made to the X-ray data shown in FIG. 6(*b*). Specifically, FIG. 6(*b*) shows that the sputtered W contains both alpha-W and beta-W which is evident in that the peak is an asymmetric peak which contains two symmetric peaks inside thereof. This data clearly shows that sputtered W forms both the alpha-and beta-phases of W. As stated above, the presence of both phases is not desirable in obtaining a barrier layer which meets all seven of the criteria mentioned in the Background Section of the present application.

While this invention has been particularly shown and described with respect to preferred embodiments thereof, it will be understood by those skilled in the art that the foregoing and other changes in form and detail may be made without departing from the spirit and scope of the present invention.

Having thus described our invention, what we claim as new, and desire to secure by Letters Patent is:

1. A method of forming an interconnect structure comprising:
    depositing a layer of a single phase of alpha-W inside a trench region of an interconnect structure, wherein said depositing comprises chemical vapor deposition (CVD) using $W(CO)_6$ as a source material under conditions sufficient to form said single phase of alpha-W; and
    filling said trench region with a conductive material comprising Cu, Al or alloys thereof, wherein said layer of said single phase of alpha-W substantially prevents out-diffusion of said conductive material.

2. The method of claim 1 wherein said single phase of alpha-W has a thickness after deposition of less than 15 nm.

3. The method of claim 2 wherein said single phase of alpha-W has a minimum thickness after deposition of no less than about 7 nm.

4. The method of claim 1 wherein said depositing step is carried out at a temperature of from about 250° to about 600° C.

5. The method of claim 4 wherein said depositing step is carried out at a temperature of from about 275° to about 500° C.

6. The method of claim 1 wherein said depositing step is carried out at a pressure of about $1\times10^{-6}$ to about $3\times10^{-3}$ Torr.

7. The method of claim 6 wherein said depositing step is carried out at a pressure of about $1\times10^{-4}$ to about $2\times10^{-3}$ Torr.

8. The method of claim 1 wherein said depositing step is carried out for a time period of from about 3 minutes to about 4 hours.

9. The method of claim 1 wherein said source material further includes hydrogen.

10. The method of claim 1 wherein prior to carried out step depositing step the base pressure is evacuated to about $1\times10^{-8}$ Torr or lower pressures.

11. The method of claim 1 wherein said depositing step provides said single phase of alpha-W having an average layer thickness variation of no more than 5%.

12. A method of forming an interconnect structure comprising:

evacuating a deposition apparatus to a base pressure of about $1\times10^{-8}$ Torr or lower; and depositing a layer of a single phase of alpha-W inside a trench region of an interconnect structure, wherein said depositing comprises chemical vapor deposition (CVD) using $W(CO)_6$ as a source material; and filling said trench region with a conductive material comprising Cu, Al or alloys thereof, wherein said layer of said single phase of alpha-W substantially prevents out-diffusion of said conductive material.

* * * * *